US008859908B2

(12) United States Patent
Wang et al.

(10) Patent No.: US 8,859,908 B2
(45) Date of Patent: Oct. 14, 2014

(54) PACKAGE CARRIER (71) Applicants: Chin-Sheng Wang, Hsinchu County (TW); Chien-Ming Chen, Hsinchu County (TW)

(72) Inventors: Chin-Sheng Wang, Hsinchu County (TW); Chien-Ming Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 100 days.

(21) Appl. No.: 13/778,078

(22) Filed: Feb. 26, 2013

(65) Prior Publication Data
US 2014/0144677 A1    May 29, 2014

(30) Foreign Application Priority Data

Nov. 23, 2012   (TW) .............................. 101143964 A (51) Int. Cl.
H05K 1/00      (2006.01)
H05K 1/11      (2006.01)
H05K 1/02      (2006.01)

(52) U.S. Cl.
CPC ................................... H05K 1/0206 (2013.01)
USPC ............................ 174/252; 174/262; 361/710

(58) Field of Classification Search
CPC ............. H05K 1/0201–1/0209; H05K 1/0221; H01L 23/24
USPC ......... 361/688, 761, 702, 703, 707, 709, 710; 174/252, 262, 264–266, 548; 257/675, 257/707, E23.08, E23.082, E23.083
See application file for complete search history.

(56) References Cited

U.S. PATENT DOCUMENTS

| | | | |
|---|---|---|---|
| 5,173,844 A * | 12/1992 | Adachi et al. ................. | 361/792 |
| 6,625,028 B1 * | 9/2003 | Dove et al. .................... | 361/707 |
| 8,531,024 B2 * | 9/2013 | Lin et al. ........................ | 257/706 |
| 2004/0065894 A1 * | 4/2004 | Hashimoto et al. ........... | 257/100 |
| 2008/0273313 A1 * | 11/2008 | Wang et al. .................... | 361/761 |
| 2010/0065307 A1 * | 3/2010 | Nagase et al. ................ | 174/252 |
| 2012/0007252 A1 * | 1/2012 | Tseng et al. ................... | 257/774 |
| 2012/0279760 A1 * | 11/2012 | Sun ................................ | 174/252 |
| 2013/0130418 A1 * | 5/2013 | Lee ................................. | 438/26 |

FOREIGN PATENT DOCUMENTS

| TW | 201232672 | 8/2012 |
|---|---|---|
| TW | 201234666 | 8/2012 |

OTHER PUBLICATIONS

Shih-Hao Sun, TW Patent Application No. 101113270, filed on Apr. 13, 2012, pp. 1-28.

* cited by examiner

*Primary Examiner* — Hoa C Nguyen
(74) *Attorney, Agent, or Firm* — Jianq Chyun IP Office (57) ABSTRACT A package carrier includes a substrate, first and second insulation layers, first and second patterned circuit layers, at least one first and second conductive through holes, a heat dissipation channel, an adhesive layer and a heat conducting element. The first and second patterned circuit layers are respectively disposed on the first and second insulation layers which are respectively disposed on upper and lower surfaces of the substrate. The heat dissipation channel at least passes through the first insulation layer, the first and second patterned circuit layers, and the substrate. The first and second conductive through holes electrically connect with the substrate, the first and second patterned circuit layers. At least two opposite side surfaces of the heat conducting element each includes at least one convex portion or at least one concave portion. The heat conducting element is mounted in the heat dissipation channel via the adhesive layer.

12 Claims, 7 Drawing Sheets

PACKAGE CARRIER

CROSS-REFERENCE TO RELATED APPLICATION

This application claims the priority benefit of Taiwan application serial no. 101143964, filed on Nov. 23, 2012. The entirety of the above-mentioned patent application is hereby incorporated by reference herein and made a part of this specification.

BACKGROUND OF THE INVENTION

1. Field of the Invention

The present invention relates to a substrate structure, and more particularly, to a package carrier.

2. Description of Related Art

In recent years, following the rapid development of electronic technology and emerging of high-tech electronic industries, high speed, multi-function, high density, light, small and low cost electronic products have been continuously introduced. These electronic products are usually provided with a package carrier. In addition to including a conductive circuit, such a package carrier may also carrier electronic elements as data processing units for the electronic products, such as, capacitors, inductors, resistors, or IC chips. However, if the electronic elements are all disposed on the package carrier, it would increase the carrier area and reduce the layout space. Therefore, embedding the electronic elements in the package carrier has become a key technology.

In general, the package carrier mainly includes multiple patterned circuit layers and at least one insulation layer. The insulation layer is disposed between two adjacent patterned circuit layers to achieve insulation therebetween. In order to enhance the heat dissipation effect, a heat dissipation block is usually mounted to a lower surface of the package carrier via an adhesive layer, such that the heat generated by the electronic elements on the package carrier may be conducted to the heat dissipation block through the patterned circuit layer and the insulation layer. Because the adhesive layer and the insulation layer generally have a poor thermal conductivity, the conduction of the heat generated by the electronic element to the heat dissipation block through the insulation layer and the adhesive layer causes an increase in thermal resistance, which hence results in poor heat dissipation. Therefore, how to effectively transfer the heat generated by the electronic element to an outside environment has become an important subject to research.

SUMMARY OF THE INVENTION

Accordingly, the present invention is directed to a package carrier adapted to carrier at least one heat generating element.

The present invention provides a package carrier including a substrate, a first insulation layer, a first patterned circuit layer, at least one first conductive through hole, a second insulation layer, a second patterned circuit layer, at least one second conductive through hole, a heat dissipation channel, an adhesive layer, and a heat conducting element. The substrate has an upper surface and a lower surface opposite to each other. The first insulation layer is disposed on the upper surface of the substrate. The first patterned circuit layer is disposed on the first insulation layer and exposes a portion of the first insulation layer. The first conductive through hole is disposed in the first insulation layer and electrically connects the substrate and the first patterned circuit layer. The second insulation layer is disposed on the lower surface of the substrate. The second patterned circuit layer is disposed on the second insulation layer and exposes a portion of the second insulation layer. The second conductive through hole is disposed in the second insulation layer and electrically connects the substrate and the second patterned circuit layer. The heat dissipation channel at least passes through the first insulation layer, the first patterned circuit layer, the substrate and the second insulation layer. The heat conducting element is disposed in the heat dissipation channel. At least two opposite side surfaces of the heat conducting element each includes at least one convex portion or at least one concave portion, and the first patterned circuit layer and the second patterned circuit layer further extend to dispose on an upper surface and a lower surface of the heat conducting element. The adhesive layer is disposed between the heat conducting element and the heat dissipation channel. The heat conducting element is mounted in the heat dissipation channel via the adhesive layer.

In one embodiment, the at least one convex portion or at least one concave portion includes multiple convex portions or multiple concave portions, and the convex portions or concave portions connect to each other to form a toothed surface.

In one embodiment, the at least one convex portion or at least one concave portion includes multiple convex portions or multiple concave portions, and the convex portions or concave portions connect to each other to form a wavy surface.

In one embodiment, the at least two opposite side surfaces of the heat conducting element further respectively have a first chamfered inclined surface and a second chamfered inclined surface, and the convex portion or the concave portion is located between the first chamfered inclined surface and the second chamfered inclined surface.

In one embodiment, the at least two opposite side surfaces of the heat conducting element further respectively have a first rounded surface and a second rounded surface, and the convex portion or the concave portion is located between the first rounded surface and the second rounded surface.

In one embodiment, the heat conducting element further includes a roughened structure formed on a surface of the heat conducting element.

In one embodiment, the ten-point average roughness (Rz) of the roughened structure ranges between 1 micrometer and 5 micrometers.

In one embodiment, the package carrier further includes a first solder mask layer and a second solder mask layer. The first solder mask layer is disposed on a portion of the first patterned circuit layer and the portion of the first insulation layer exposed by the first patterned circuit layer. The second solder mask layer is disposed on a portion of the second patterned circuit layer and the portion of the second insulation layer exposed by the second patterned circuit layer.

In one embodiment, the package carrier further includes a first surface protective layer and a second surface protective layer. The first surface protective layer is disposed on the first patterned circuit layer and covers the portion of the first patterned circuit layer exposed by the first solder mask layer, the adhesive layer and the upper surface of the heat conducting element. The second surface protective layer is disposed on the second patterned circuit layer and covers the portion of the second patterned circuit layer exposed by the second solder mask layer, the adhesive layer and the lower surface of the heat conducting element.

In one embodiment, the material of the heat conducting element includes ceramic, silicon, silicon carbide, diamond or metal.

In one embodiment, the package carrier further includes a conducting layer covering an inner wall of the heat dissipation channel. The conducting layer connects the first patterned circuit layer and the second patterned circuit layer.

In one embodiment, the package carrier further comprises a conducting structure disposed beside the heat dissipation channel and passing through the first insulation layer, the substrate and the second insulation layer. The conducting structure connects the first patterned circuit layer and the second patterned circuit layer.

In view of the foregoing, the at least two opposite side surfaces of the heat conducting element of the present invention each includes at least one convex portion or at least concave portion. Therefore, when the heat conducting element is disposed in the heat dissipation channel, the convex portion or concave portion and the adhesive layer have an improved anti-shear characteristic, which can therefore reduce the possibility of the heat conducting element and the adhesive layer becoming disengaged from each other. In addition, the package carrier of the present invention includes the heat conducting element, and the heat conducting element is embedded in the substrate. Therefore, when a heat generating element is disposed on the package carrier, the heat generated by the heat generating element may be quickly transmitted to the outside environment through the heat conducting element, thus effectively dissipating the heat generated by the heat generating element and hence improving the use efficiency and lifespan of the heat generating element.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF THE EMBODIMENTS

Figure 1:
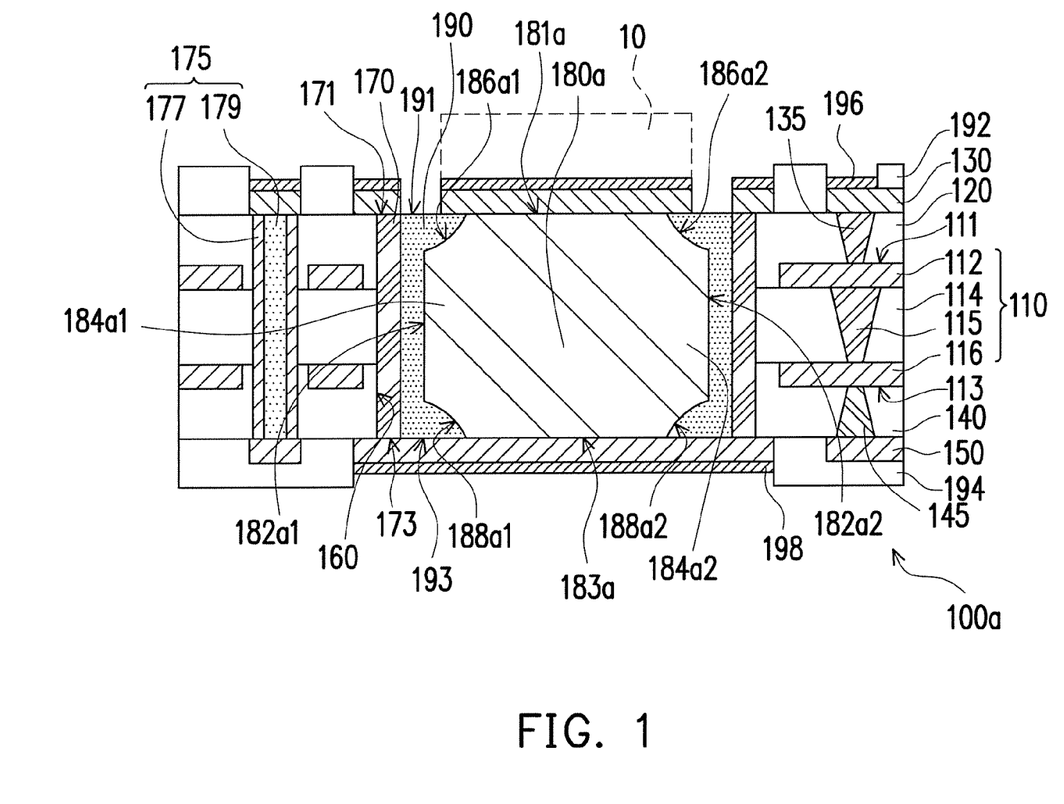
FIG. 1 is a cross-sectional view of a package carrier according to one embodiment of the present invention.

FIG. 1 is a cross-sectional view of a package carrier according to one embodiment of the present invention. Referring to FIG. 1, in the present embodiment, the package carrier 100a includes a substrate 110, a first insulation layer 120, a first patterned circuit layer 130, at least one first conductive through hole 135, a second insulation layer 140, at least one second conductive through hole 145, a second patterned circuit layer 150, a heat dissipation channel 160, a heat conducting element 180a and an adhesive layer 190.

Specifically, the substrate 110 has an upper surface 111 and a lower surface 113 opposite to each other. The first insulation layer 120 is disposed on the upper surface 111 of the substrate 110. The first patterned circuit layer 130 is disposed on the first insulation layer 120 and exposes a portion of the first insulation layer 120. The second insulation layer 140 is disposed on the lower surface 113 of the substrate 110. The second patterned circuit layer 150 is disposed on the second insulation layer 140 and exposes a portion of the second insulation layer 140. The heat dissipation channel 160 at least passes through the first insulation layer 120, the first patterned circuit layer 130, the substrate 110, and the second patterned circuit layer 150. The heat conducting element 180a is disposed in the heat dissipation channel 160. At least two opposite side surfaces 182a1, 182a2 of the heat conducting element 180a respectively include at least one convex portion 184a1 and at least one convex portion 184a2 (only one convex portion is illustrated in FIG. 1 for each side surface). The first patterned circuit layer 130 and the second patterned circuit layer 150 further extend to dispose on an upper surface 181a and a lower surface 183a of the heat conducting element 180a. The adhesive layer 190 is disposed between the heat conducting element 180a and the heat dissipation channel 160, and the heat conducting element 180a is mounted to the heat dissipation channel 160 via the adhesive layer 190.

More specifically, in the present embodiment, the substrate 110 includes, for example, a first copper foil layer 112, a core dielectric layer 114, at least one conductive through hole 115, and a second copper foil layer 116. The core dielectric layer 114 is disposed between the first copper foil layer 112 and the second copper foil layer 116, and the conductive through hole 115 passes through the core dielectric layer 114 and electrically connects the first copper foil layer 112 and the second copper foil layer 116. That is, the substrate 110 of the present embodiment is a double sided substrate. It is noted, however, that in various other embodiments, the substrate 110 may also be a multisided substrate, or the substrate 110 may be a fiberglass substrate (FR4). Therefore, the substrate 110 is not intended to be limited to any particular form. In addition, the first conductive through hole 135 is disposed in the first insulation layer 120 and electrically connects the first copper foil layer 112 of the substrate 110 and the first patterned circuit layer 130. The second conductive through hole 145 is disposed in the second insulation layer 140 and electrically connects the second copper foil layer 116 of the substrate 110 and the second patterned circuit layer 150. The material of the first insulation layer 120 and the second insulation layer 140 is, for example, polyimide (PI) or epoxy.

The package carrier 100a may further include a conducting layer 170 and a conducting structure 175. The conducting layer 170 covers an inner wall of the heat conducting channel 160 and electrically connects the first patterned circuit layer 130 and the second patterned circuit layer 150. The conducting structure 175 is disposed beside the heat conducting channel 160. As shown in FIG. 1, the conducting structure 175 and the conductive through hole 115, the first conductive through hole 135 and the second conductive through hole 145 are respectively disposed at opposite sides of the heat dissipation channel 160 for electrically connecting the first patterned circuit layer 130 and the second patterned circuit layer 150. The conducting structure 175 includes, for example, a straight through hole 177 and a filled material 179. The straight through hole 177 passes through the first insulation layer 120, the substrate 110, and the second insulation layer 140 to electrically connect the first patterned circuit layer 130 and the second patterned circuit layer 150, and the filled material 179 is filled in the straight through hole 177. The material of the filled material 179 is, for example, conductive gel or epoxy.

In particular, the at least two opposite side surfaces 182a1, 182a2 of the heat conducting element 180a of the present embodiment further respectively include first rounded surfaces 186a1, 186a2 and second rounded surfaces 188a1, 188a2. The convex portion 184a1 is located between and connects with the first rounded surface 186a1 and the second rounded surface 188a1. The convex portion 184a2 is located between and connects with the first rounded surface 186a2 and the second rounded surface 188a2. The adhesive layer 190 is located between the at least two side surfaces 182a1, 182a2 of the heat conducting element 180a and the conducting layer 170 and is filled to completely cover the first rounded surfaces 186a1, 186a2 and the second rounded surfaces 188a1, 188a2. The material of the heat conducting element 180a is, for example, ceramic, silicon, silicon carbide, diamond or metal. In addition, the material of the adhesive layer 190 is, for example, resin, epoxy or other gel material.

In addition, the package carrier 100a of the present embodiment further includes a first solder mask layer 192 and a second solder mask layer 194. The first solder mask layer 192 is disposed on a portion of the first patterned circuit layer 130 and the portion of the first insulation layer 120 exposed by the first patterned circuit layer 130. The second solder mask layer 194 is disposed on a portion of the second patterned circuit layer 150 and the portion of the second insulation layer 140 exposed by the second patterned circuit layer 150. In addition, the package carrier may further include a first surface protective layer 196 and a second surface protective layer 198. The first surface protective layer 196 is disposed on the first patterned circuit layer 130 and covers the portion of the first patterned circuit layer 130 exposed by the first solder mask layer 192 and upper surfaces 171, 191, 181a of the conducting layer 170, the adhesive layer 190 and the heat conducting element 180a adjacent the first patterned circuit layer 130. The second surface protective layer 198 is disposed on the second patterned circuit layer 150 and covers the portion of the second patterned circuit layer 150 exposed by the second solder mask layer 194 and lower surfaces 173, 193, 183a of the conducting layer 170, the adhesive layer 190 and the heat conducting element 180a adjacent the second patterned circuit layer 150. In addition, the first surface protective layer 196 and the second surface protective layer 198 include, but not limited to, for example, a nickel layer, a gold layer, a silver layer, a nickel-palladium-gold layer or another layer of a suitable material.

In the present embodiment, the at least two opposite side surfaces 182a1, 182a2 of the heat conducting element 180a respectively include the convex portions 184a1, 184a2, and the convex portions 184a1, 184a2 are respectively located between and connect with the first rounded surfaces 186a1, 186a2 and the second rounded surfaces 188a1, 188a2. Therefore, when the heat conducting element 180a is disposed in the heat dissipation channel 160, the convex portions 184a1, 184a2, the first rounded surfaces 186a1, 186a2, the second rounded surfaces 188a1, 188a2 and the adhesive layer 190 have an improved anti-shear characteristic therebetween, which can reduce the possibility of the heat conducting element 180a and the adhesive layer 190 becoming disengaged from each other. In addition, in the present embodiment, the package carrier 100a includes the heat conducting element 180a, and the heat conducting element 180a is embedded in the substrate 110. Therefore, when a heat generating element 10 is disposed on the package carrier 100a, heat generated by the heat generating element 10 may be quickly transmitted to the outside environment through the heat conducting element 180a, the first surface protective layer 196 and the second surface protective layer 198, thus effectively dissipating the heat generated by the heat generating element 10 and hence improving the use efficiency and lifespan of the heat generating element 10. Here, the heat generating element 10 includes, but not limited to, for example, an electric chip or a photoelectric element. A nonrestrictive example of the heat generating element 10 is a semiconductor integrated circuit (IC) or a light emitting diode (LED).

It is noted that the present invention is not intended to limit the heat conducting element 180a to any particular structure. Below, several embodiments are described to illustrate different forms of the heat conducting elements 180b, 180c, 180d, 180e. It is to be noted that the following embodiments continue to use the reference numerals and part of the contents of the previous embodiment, where the same reference numerals are used to indicate the same or similar elements, and the technical contents that are the same as in the previous embodiment are not repeated herein.

Figure 2:
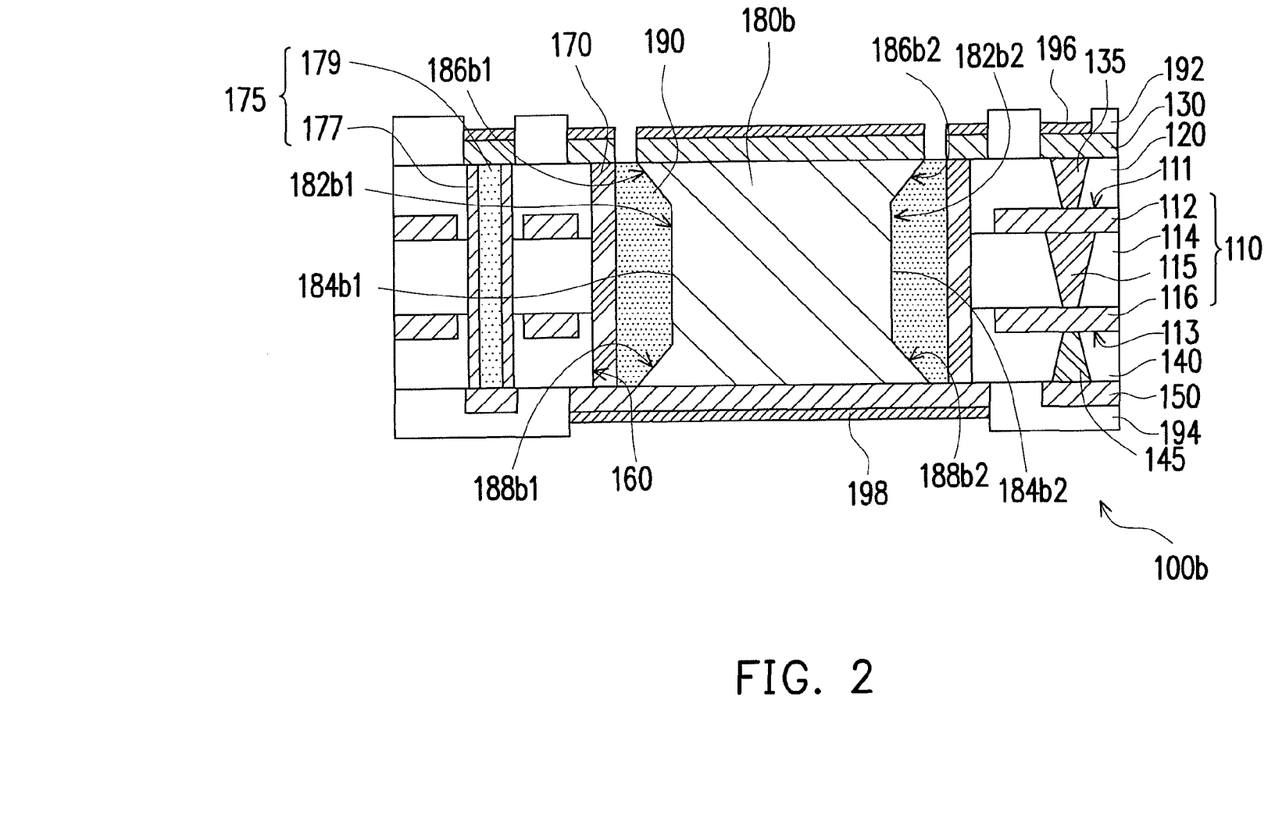
FIG. 2 is a cross-sectional view of a package carrier according to another embodiment of the present invention.

FIG. 2 is a cross-sectional view of a package carrier according to another embodiment of the present invention. Referring to FIG. 1 and FIG. 2, the package carrier 100b of the present embodiment is similar to the package carrier 100a of FIG. 1. The main difference between the two includes that, the at least two opposite side surfaces 182b1, 182b2 of the heat conducting element 180b of the present embodiment respectively include at least one concave portion 184b1, 184b2 (only one concave portion is illustrated in FIG. 2 for each side surface), a first chamfered inclined surface 186b1, 186b2, and a second chamfered inclined surface 188b1, 188b2. The concave portion 184b1 is located between and connects with the first chamfered inclined surface 186b1 and the second chamfered inclined surface 188b1, and the concave portion 184b2 is located between and connects with the first chamfered inclined surface 186b2 and the second chamfered inclined surface 188b2. The adhesive layer 190 is located between the at least two opposite side surfaces 182b1, 182b2 of the heat conducting element 180b and the conducting layer 170 and is filled to completely cover the first chamfered inclined surfaces 186b1, 186b2 and the second chamfered inclined surfaces 188b1, 188b2.

The at least two opposite side surfaces 182b1, 182b2 of the heat conducting element 180b of the present embodiment respectively include the concave portions 184b1, 184b2, and the concave portions 184b1, 184b2 are respectively located between and connect with the first chamfered inclined surfaces 186b1, 186b2 and the second chamfered inclined surfaces 188b1, 188b2. Therefore, when the heat conducting element 180b is disposed in the heat dissipation channel 160, the concave portions 184b1, 184b2, the first chamfered inclined surfaces 186b1, 186b2, the second chamfered inclined surfaces 188b1, 188b2 and the adhesive layer 190 have an improved anti-shear characteristic therebetween, which can reduce the possibility of the heat conducting element 180b and the adhesive layer 190 becoming disengaged from each other.

Figure 3:
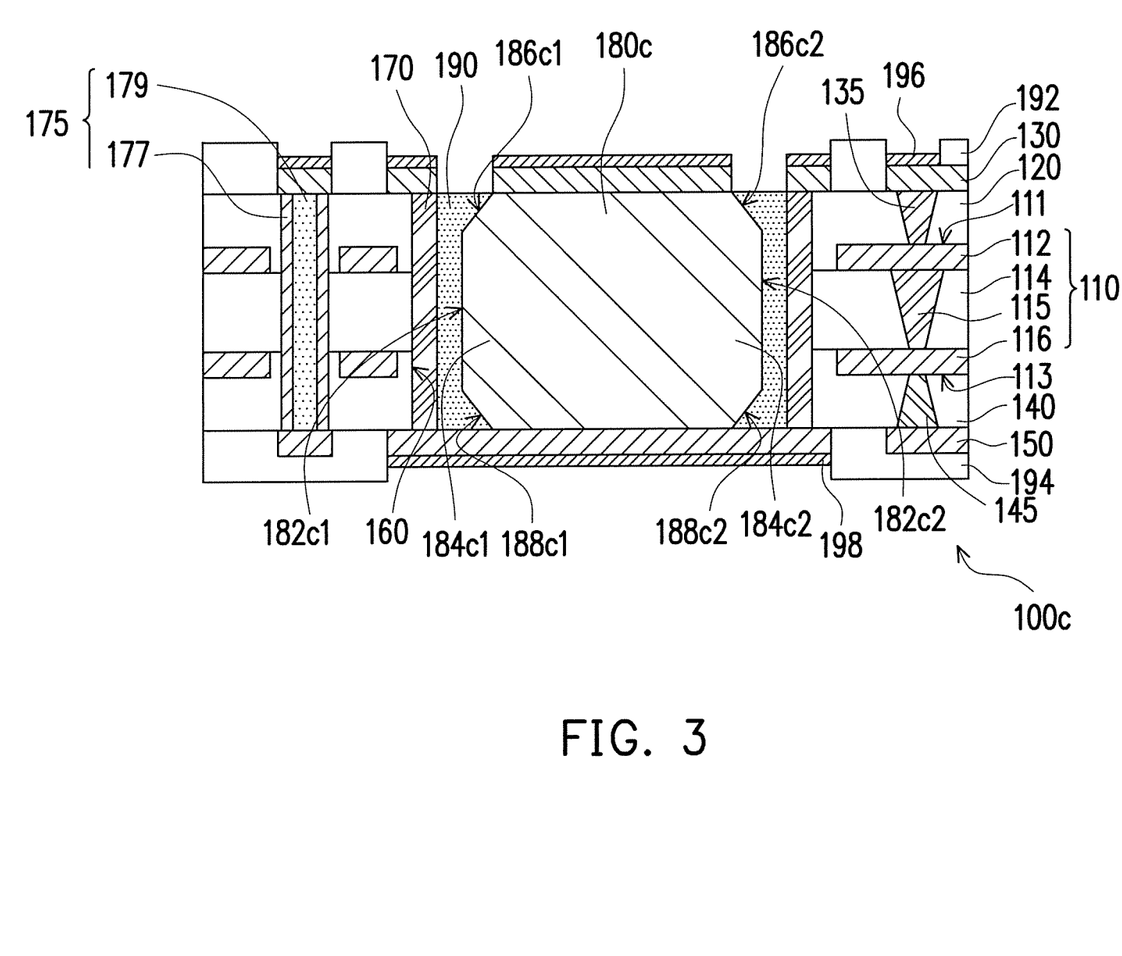
FIG. 3 is a cross-sectional view of a package carrier according to another embodiment of the present invention.

FIG. 3 is a cross-sectional view of a package carrier according to another embodiment of the present invention. Referring to FIG. 1 and FIG. 3, the package carrier 100c of the present embodiment is similar to the package carrier 100a of FIG. 1. The main difference between the two includes that, the at least two opposite side surfaces 182c1, 182c2 of the heat conducting element 180c of the present embodiment respectively include a first chamfered inclined surface 186c1, 186c2 and a second chamfered inclined surface 188b1, 188b2. A convex portion 184c1 is located between and connects with the first chamfered inclined surface 186c1 and the second chamfered inclined surface 188c1, and a convex portion 184c2 is located between and connects with the first chamfered inclined surface 186c2 and the second chamfered inclined surface 188c2. The adhesive layer 190 is located between the at least two opposite side surfaces 182c1, 182c2 of the heat conducting element 180c and the conducting layer 170 and is filled to completely cover the first chamfered inclined surfaces 186c1, 186c2 and the second chamfered inclined surfaces 188c1, 188c2.

The at least two opposite side surfaces 182c1, 182c2 of the heat conducting element 180c of the present embodiment respectively include the convex portions 184c1, 184c2, and the convex portions 184c1, 184c2 are respectively located between and connect with the first chamfered inclined surfaces 186c1, 186c2 and the second chamfered inclined surfaces 188c1, 188c2. Therefore, when the heat conducting element 180c is disposed in the heat dissipation channel 160, the convex portions 184c1, 184c2, the first chamfered inclined surfaces 186c1, 186c2, the second chamfered inclined surfaces 188c1, 188c2 and the adhesive layer 190 have an improved anti-shear characteristic therebetween, which can reduce the possibility of the heat conducting element 180c and the adhesive layer 190 becoming disengaged from each other.

Figure 4:
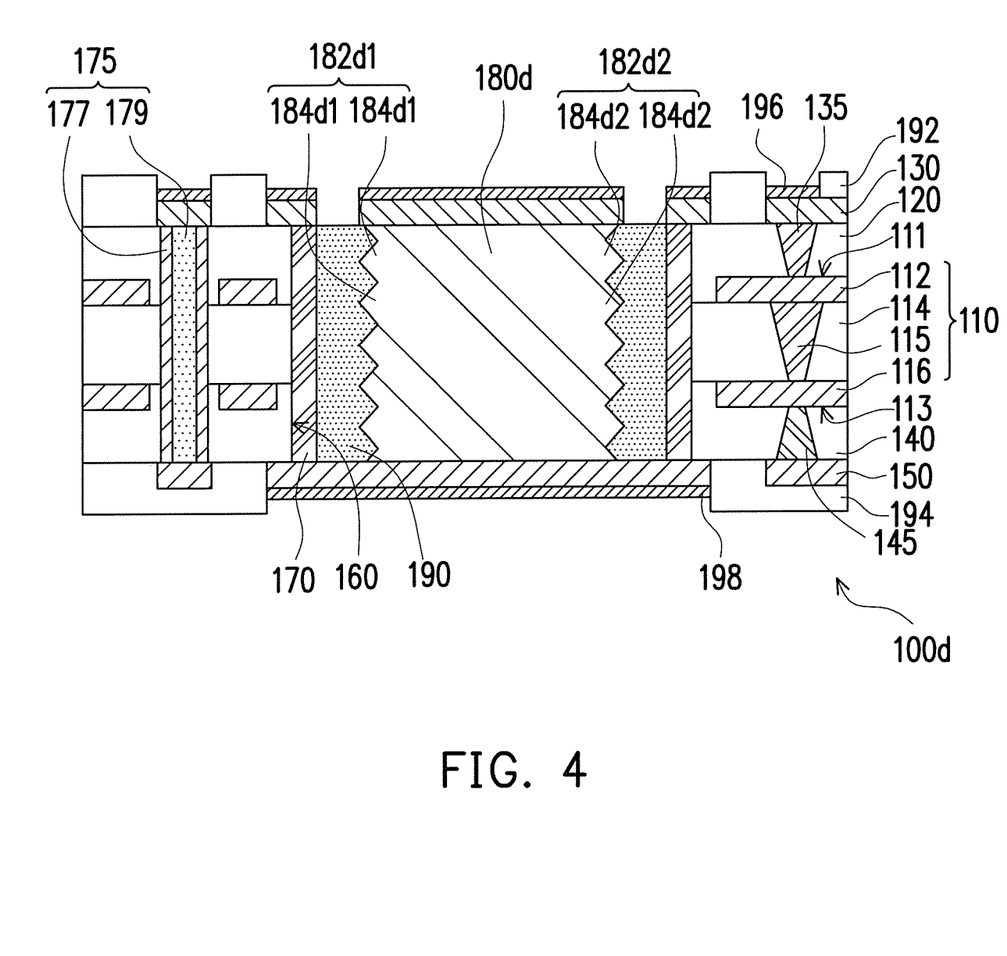
FIG. 4 is a cross-sectional view of a package carrier according to another embodiment of the present invention.

FIG. 4 is a cross-sectional view of a package carrier according to another embodiment of the present invention. Referring to FIG. 1 and FIG. 4, the package carrier 100d of the present embodiment is similar to the package carrier 100a of FIG. 1. The main difference between the two includes that, the at least two opposite side surfaces 182d1, 182d2 of the heat conducting element 180d of the present embodiment respectively include multiple convex portions 184d1, 184d2. The convex portions 184d1 on the side surface 182d1 connect to each other to form a toothed surface, and the convex portions 184d2 on the side surface 182d2 connect to each other to form a toothed surface.

The at least two opposite side surfaces 182d1, 182d2 of the heat conducting element 180d of the present embodiment respectively include multiple convex portions 184d1, 184d2, and the convex portions 184d1, 184d2 connect to each other to form the toothed surfaces. Therefore, when the heat conducting element 180d is disposed in the heat dissipation channel 160, the toothed surfaces of the heat conducting element 180d and the adhesive layer 190 have an improved anti-shear characteristic therebetween, which can reduce the possibility of the heat conducting element 180d and the adhesive layer 190 becoming disengaged from each other.

Figure 5:
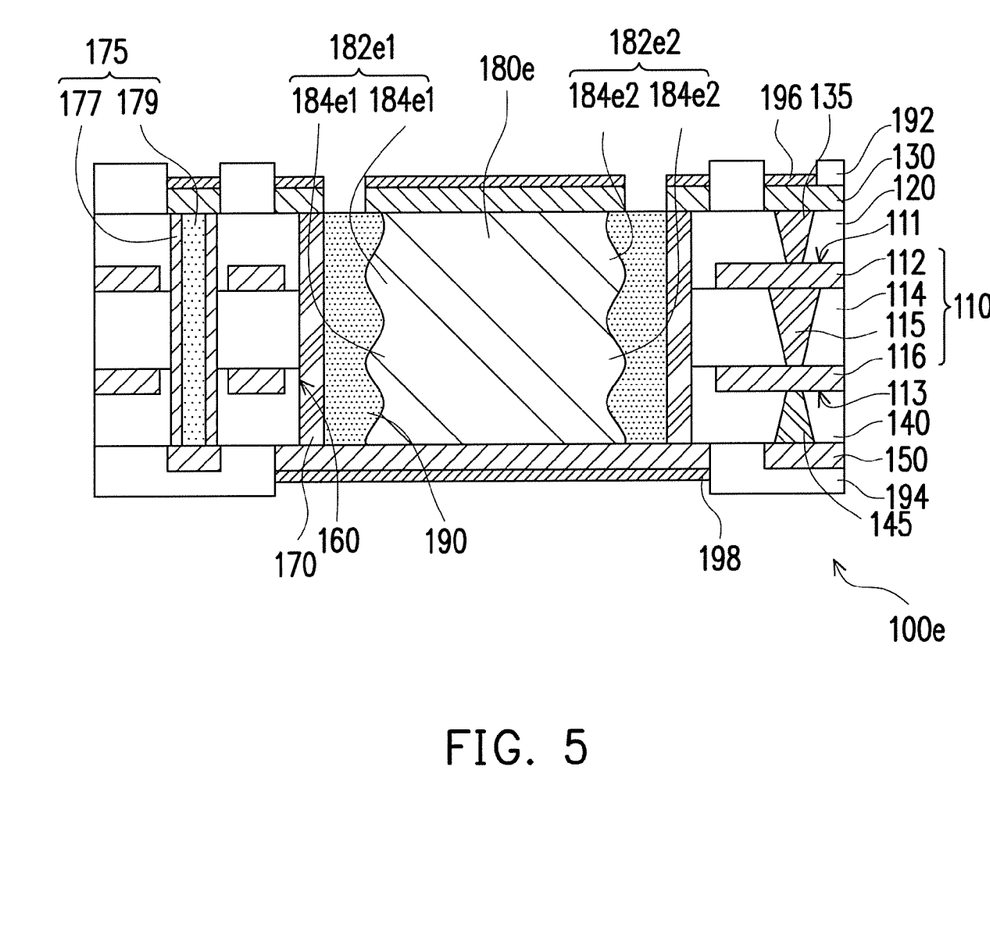
FIG. 5 is a cross-sectional view of a package carrier according to another embodiment of the present invention.

FIG. 5 is a cross-sectional view of a package carrier according to another embodiment of the present invention. Referring to FIG. 1 and FIG. 5, the package carrier 100e of the present embodiment is similar to the package carrier 100a of FIG. 1. The main difference between the two includes that, the at least two opposite side surfaces 182e1, 182e2 of the heat conducting element 180e of the present embodiment respectively include multiple convex portions 184e1, 184e2. The convex portions 184e1 on the side surface 182e1 connect to each other to form a wavy surface, and the convex portions 184e2 on the side surface 182e2 connect to each other to form a wavy surface.

The at least two opposite side surfaces 182e1, 182e2 of the heat conducting element 180e of the present embodiment respectively include multiple convex portions 184e1, 184e2, and the convex portions 184e1, 184e2 connect to each other to form the toothed surfaces. Therefore, when the heat conducting element 180e is disposed in the heat dissipation channel 160, the wavy surfaces of the heat conducting element 180e and the adhesive layer 190 have an improved anti-shear characteristic therebetween, which can reduce the possibility of the heat conducting element 180e and the adhesive layer 190 becoming disengaged from each other.

Figure 6:
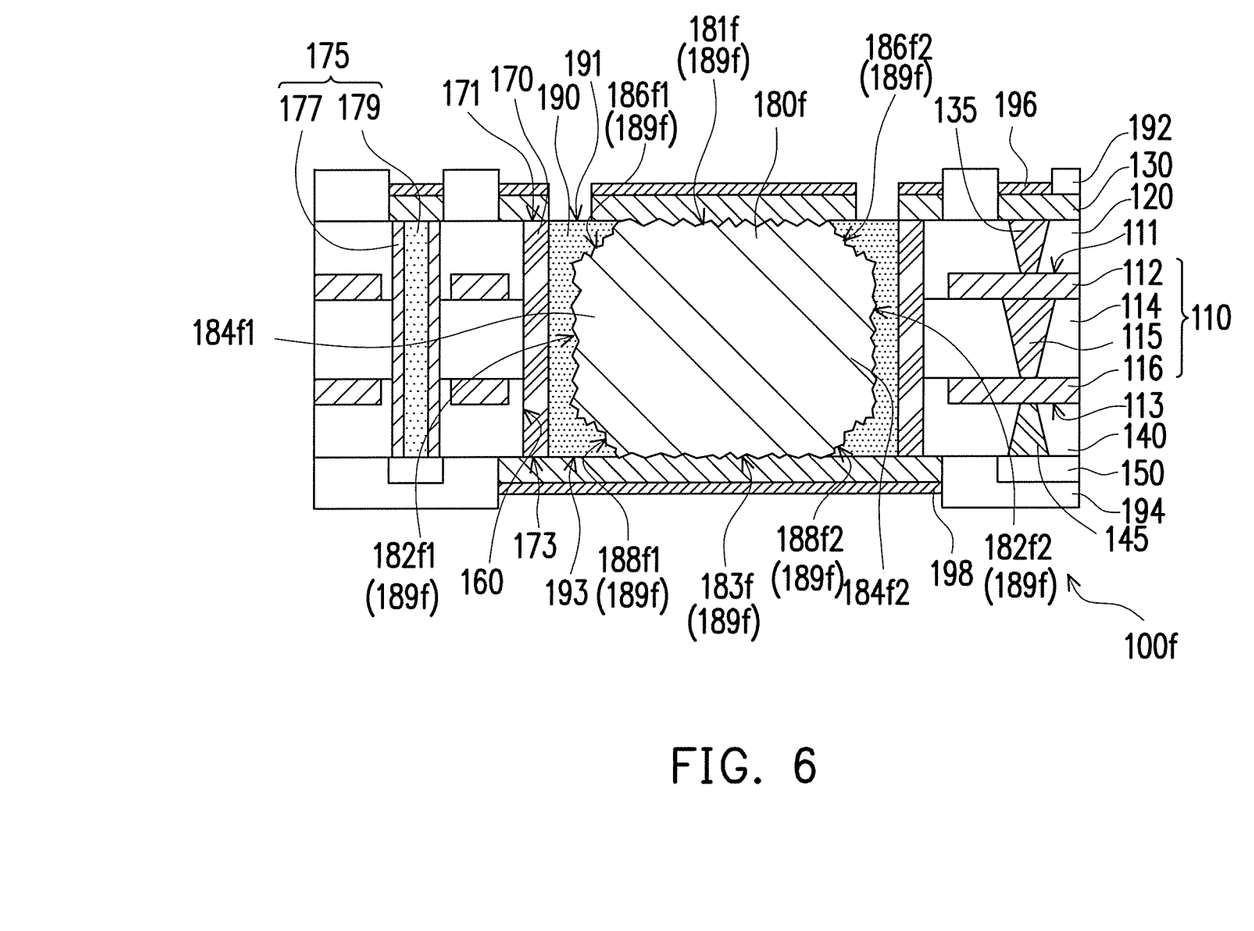
FIG. 6 is a cross-sectional view of a package carrier according to another embodiment of the present invention.

FIG. 6 is a cross-sectional view of a package carrier according to another embodiment of the present invention. Referring to FIG. 1 and FIG. 6, the package carrier 100f of the present embodiment is similar to the package carrier 100a of FIG. 1. The main difference between the two includes that, the heat conducting element 180f further includes a roughened structure 189f formed on a surface of the heat conducting element 180f. That is, the roughened structure 189f is at least formed on two opposite side surfaces 182f1, 182f2, first rounded surfaces 186f1, 186f2, second rounded surfaces 188f1, 188f2, an upper surface 181f and a lower surface 183f of the heat conducting element 180f of the present embodiment. Here, the ten-point average roughness (Rz) of each roughened structure 189f ranges, for example, between 1 micrometer and 5 micrometers.

The at least two opposite side surfaces 182f1, 182f2 of the heat conducting element 180f of the present embodiment respectively include convex portions 184f1, 184f2, and the convex portions 184f1, 184f2 are respectively located between and connect to the first rounded surfaces 186f1, 186f2 and the second rounded surfaces 188f1, 188f2. In addition, the roughened structure 189f is at least formed on the opposite side surfaces 182f1, 182f2, the first rounded surfaces 186f1, 186f2, the second rounded surfaces 188f1, 188f2, the upper surface 181f and the lower surface 183f of the heat conducting element 180f. Therefore, when the heat conducting element 180f is disposed in the heat dissipation channel 160, the convex portions 184f1, 184f2, the first rounded surfaces 186f1, 186f2, the second rounded surfaces 188f1, 188f2, the roughened structure 189f have an improved anti-shear characteristic therebetween, which can reduce the possibility of the heat conducting element 180f and the adhesive layer 190 becoming disengaged from each other.

Figure 7:
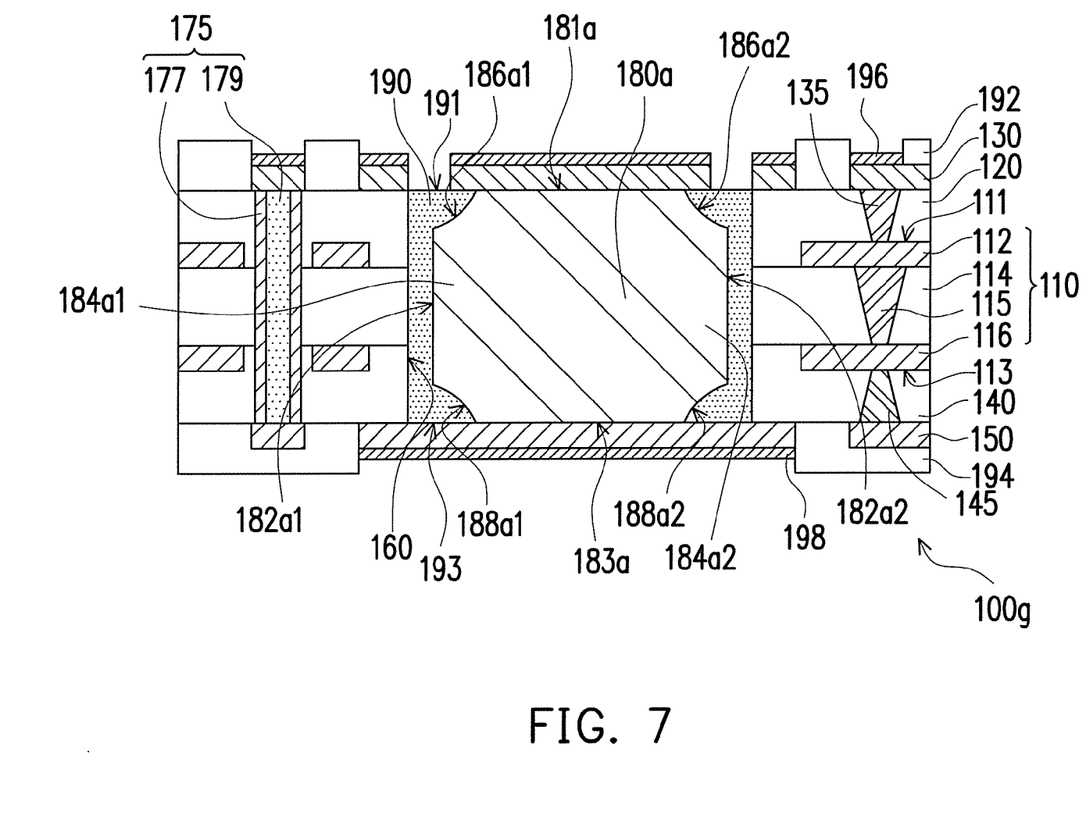
FIG. 7 is a cross-sectional view of a package carrier according to still another embodiment of the present invention.

FIG. 7 is a cross-sectional view of a package carrier according to another embodiment of the present invention. Referring to FIG. 1 and FIG. 7, the package carrier 100g of the present embodiment is similar to the package carrier 100a of FIG. 1. The main difference between the two includes that, the package carrier 100g of the present embodiment includes no conducting layer 170. That is, the first patterned circuit layer 130 and the second patterned circuit layer 150 are electrically connected through the first conductive through hole 135, the conductive through hole 115 of the substrate 110 and the second conductive through hole 145, or through the conducting structure 175 passing through the first insulation layer 120, the substrate 110 and the second insulation layer 140.

In summary, the at least two opposite side surfaces of the heat conducting element of the present invention each includes at least one convex portion or at least concave portion. Therefore, when the heat conducting element is disposed in the heat dissipation channel, the convex portion or concave portion and the adhesive layer have an improved anti-shear characteristic, which can therefore reduce the possibility of the heat conducting element and the adhesive layer becoming disengaged from each other. In addition, the package carrier of the present invention includes the heat conducting element, and the heat conducting element is embedded in the substrate. Therefore, when a heat generating element is disposed on the package carrier, the heat generated by the heat generating element may be quickly transmitted to the outside environment through the heat conducting element, thus effectively dissipating the heat generated by the heat generating element and hence improving the use efficiency and lifespan of the heat generating element.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package carrier comprising:
   a substrate having an upper surface and a lower surface opposite to each other;
   a first insulation layer disposed on the upper surface of the substrate;
   a first patterned circuit layer disposed on the first insulation layer and exposing a portion of the first insulation layer;
   at least one first conductive through hole disposed in the first insulation layer and electrically connecting the substrate and the first patterned circuit layer;
   a second insulation layer disposed on the lower surface of the substrate;
   a second patterned circuit layer disposed on the second insulation layer and exposing a portion of the second insulation layer;
   at least one second conductive through hole disposed in the second insulation layer and electrically connecting the substrate and the second patterned circuit layer;
   a heat dissipation channel at least passing through the first insulation layer, the first patterned circuit layer, the substrate and the second insulation layer;
   a heat conducting element disposed in the heat dissipation channel, wherein at least two opposite side surfaces of the heat conducting element each comprises at least one convex portion or at least one concave portion, and the first patterned circuit layer and the second patterned circuit layer further extend to dispose on an upper surface and a lower surface of the heat conducting element; and
   an adhesive layer disposed between the heat conducting element and the heat dissipation channel, wherein the heat conducting element is mounted in the heat dissipation channel via the adhesive layer.

2. The package carrier as recited in claim 1, wherein the at least one convex portion or at least one concave portion comprises multiple convex portions or multiple concave portions, and the convex portions or concave portions connect to each other to form a toothed surface.

3. The package carrier as recited in claim 1, wherein the at least one convex portion or at least one concave portion comprises multiple convex portions or multiple concave portions, and the convex portions or concave portions connect to each other to form a wavy surface.

4. The package carrier as recited in claim 1, wherein the at least two opposite side surfaces of the heat conducting element further respectively have a first chamfered inclined surface and a second chamfered inclined surface, and the convex portion or the concave portion is located between the first chamfered inclined surface and the second chamfered inclined surface.

5. The package carrier as recited in claim 1, wherein the at least two opposite side surfaces of the heat conducting element further respectively have a first rounded surface and a second rounded surface, and the convex portion or the concave portion is located between the first rounded surface and the second rounded surface.

6. The package carrier as recited in claim 1, wherein the heat conducting element further comprises a roughened structure formed on a surface of the heat conducting element.

7. The package carrier as recited in claim 6, wherein the ten-point average roughness of the roughened structure ranges between 1 micrometer and 5 micrometers.

8. The package carrier as recited in claim 1, further comprising:
   a first solder mask layer disposed on a portion of the first patterned circuit layer and the portion of the first insulation layer exposed by the first patterned circuit layer; and
   a second solder mask layer disposed on a portion of the second patterned circuit layer and the portion of the second insulation layer exposed by the second patterned circuit layer.

9. The package carrier as recited in claim 8, further comprising:
   a first surface protective layer disposed on the first patterned circuit layer and covering the portion of the first patterned circuit layer exposed by the first solder mask layer, the adhesive layer and the upper surface of the heat conducting element; and
   a second surface protective layer disposed on the second patterned circuit layer and covering the portion of the second patterned circuit layer exposed by the second solder mask layer, the adhesive layer and the lower surface of the heat conducting element.

10. The package carrier as recited in claim 1, wherein the material of the heat conducting element comprises ceramic, silicon, silicon carbide, diamond or metal.

11. The package carrier as recited in claim 1, further comprising a conducting layer covering an inner wall of the heat dissipation channel, wherein the conducting layer connects the first patterned circuit layer and the second patterned circuit layer.

12. The package carrier as recited in claim 1, further comprising a conducting structure disposed beside the heat dissipation channel and passing through the first insulation layer, the substrate and the second insulation layer, wherein the conducting structure connects the first patterned circuit layer and the second patterned circuit layer.

* * * * *